(12) United States Patent
Oliveti

(10) Patent No.: US 11,574,799 B2
(45) Date of Patent: Feb. 7, 2023

(54) ARC SUPPRESSION DEVICE FOR PLASMA PROCESSING EQUIPMENT

(71) Applicant: Anthony Oliveti, San Jose, CA (US)

(72) Inventor: Anthony Oliveti, San Jose, CA (US)

(73) Assignee: COMET TECHNOLOGIES USA, INC., San Jose, CA (US)

( * ) Notice: Subject to any disclaimer, the term of this patent is extended or adjusted under 35 U.S.C. 154(b) by 13 days.

(21) Appl. No.: 17/458,764

(22) Filed: Aug. 27, 2021

(65) Prior Publication Data

US 2021/0391148 A1 Dec. 16, 2021

Related U.S. Application Data

(63) Continuation of application No. 16/456,598, filed on Jun. 28, 2019, now Pat. No. 11,114,279.

(51) Int. Cl.
*H01J 37/32* (2006.01)

(52) U.S. Cl.
CPC ............... *H01J 37/32183* (2013.01); *H01J 2237/3322* (2013.01)

(58) Field of Classification Search
None
See application file for complete search history.

(56) References Cited

U.S. PATENT DOCUMENTS

| 4,679,007 A | 7/1987 | Reese et al. |
| 5,175,472 A | 12/1992 | Johnson, Jr. et al. |
| 5,195,045 A | 3/1993 | Keane et al. |
| 5,394,061 A | 2/1995 | Fujii |
| 5,474,648 A | 12/1995 | Patrick et al. |

(Continued)

FOREIGN PATENT DOCUMENTS

| JP | 04239211 A | 8/1992 |
| JP | 05284046 A | 8/1993 |

(Continued)

OTHER PUBLICATIONS

PCT/US2018/062951—International Search Report and Written Opinion of International Searching Authority, dated Aug. 28, 2019, 10 pages.

(Continued)

*Primary Examiner* — Srinivas Sathiraju
(74) *Attorney, Agent, or Firm* — Nolte Lackenbach Siegel

(57) ABSTRACT

The present disclosure relates to plasma generation systems particularly applicable to systems which utilize plasma for semiconductor processing. A plasma generation system consistent with the present disclosure includes an arc suppression device coupled to the RF generator. The arc device includes switches that engage upon a triggering signal. In addition, the arc device includes a power dissipater to be engaged by the set of switches to dissipate both stored and delivered energy when the set of switches engage. The arc suppression device also includes an impedance transformer coupled to the power dissipater to perform an impedance transformation that, when the switches are engaged in conjunction with the power dissipater, reduces the reflection coefficient at the input of the device. The plasma generation system further includes a matching network coupled to the radio frequency generator and a plasma chamber coupled to the matching network.

20 Claims, 12 Drawing Sheets

(56) References Cited

U.S. PATENT DOCUMENTS

| | | | |
|---|---|---|---|
| 5,556,501 A * | 9/1996 | Collins | H01J 37/3222 |
| | | | 257/E21.252 |
| 5,576,629 A | 11/1996 | Turner et al. | |
| 5,594,461 A * | 1/1997 | O'Neill, Jr. | H01Q 21/0025 |
| | | | 343/895 |
| 5,609,737 A | 3/1997 | Fukui et al. | |
| 5,629,653 A | 5/1997 | Stimson | |
| 5,707,486 A * | 1/1998 | Collins | H01J 37/32082 |
| | | | 204/298.34 |
| 5,737,175 A | 4/1998 | Grosshart et al. | |
| 5,792,261 A | 8/1998 | Hama et al. | |
| 5,810,963 A | 9/1998 | Tomioka | |
| 5,842,154 A | 11/1998 | Harnett et al. | |
| 5,849,136 A | 12/1998 | Mintz et al. | |
| 5,866,869 A | 2/1999 | Schneider | |
| 5,889,252 A | 3/1999 | Williams et al. | |
| 5,910,886 A | 6/1999 | Coleman | |
| 5,914,974 A | 6/1999 | Partlo | |
| 6,016,131 A | 1/2000 | Sato et al. | |
| 6,068,784 A * | 5/2000 | Collins | H01J 37/321 |
| | | | 257/E21.252 |
| 6,157,179 A | 12/2000 | Miermans | |
| 6,164,241 A | 12/2000 | Chen et al. | |
| 6,251,792 B1 * | 6/2001 | Collins | H01L 21/6831 |
| | | | 257/E21.252 |
| 6,252,354 B1 | 6/2001 | Collins et al. | |
| 6,313,584 B1 | 11/2001 | Johnson et al. | |
| 6,313,587 B1 | 11/2001 | MacLennan et al. | |
| 6,326,597 B1 | 12/2001 | Lubomirsky et al. | |
| 6,407,648 B1 | 6/2002 | Johnson | |
| 6,444,137 B1 * | 9/2002 | Collins | H01J 37/32174 |
| | | | 257/E21.252 |
| 6,455,437 B1 | 9/2002 | Davidow et al. | |
| 6,463,875 B1 | 10/2002 | Chen et al. | |
| 6,507,155 B1 | 1/2003 | Barnes et al. | |
| 6,518,195 B1 * | 2/2003 | Collins | C23C 16/517 |
| | | | 438/743 |
| 6,545,420 B1 * | 4/2003 | Collins | H01J 37/32091 |
| | | | 257/E21.252 |
| 6,677,828 B1 | 1/2004 | Harnett et al. | |
| 6,703,080 B2 * | 3/2004 | Reyzelman | H05H 1/46 |
| | | | 204/192.1 |
| 6,806,437 B2 | 10/2004 | Oh | |
| 6,876,155 B2 | 4/2005 | Howald et al. | |
| 6,894,245 B2 | 5/2005 | Hoffman | |
| 6,949,887 B2 | 9/2005 | Kirkpatrick et al. | |
| 7,030,335 B2 | 4/2006 | Hoffman | |
| 7,042,311 B1 | 5/2006 | Hilliker et al. | |
| 7,079,597 B1 | 7/2006 | Shiraishi et al. | |
| 7,102,292 B2 | 9/2006 | Parsons et al. | |
| 7,192,505 B2 | 3/2007 | Roche et al. | |
| 7,196,283 B2 | 3/2007 | Buchberger, Jr. | |
| 7,215,697 B2 | 5/2007 | Hill et al. | |
| 7,220,937 B2 | 5/2007 | Hoffman | |
| 7,251,121 B2 | 7/2007 | Bhutta | |
| 7,259,623 B2 | 8/2007 | Coleman | |
| 7,298,128 B2 | 11/2007 | Bhutta | |
| 7,467,612 B2 | 12/2008 | Suckewer | |
| 7,514,936 B2 | 4/2009 | Anwar | |
| 7,795,877 B2 | 9/2010 | Radtke | |
| 7,796,368 B2 | 9/2010 | Kotani | |
| 8,169,162 B2 | 5/2012 | Yuzurihara | |
| 8,203,372 B2 | 6/2012 | Arduini | |
| 8,222,822 B2 | 7/2012 | Gilbert | |
| 8,421,377 B2 | 4/2013 | Kirchmeier | |
| 8,466,622 B2 | 6/2013 | Knaus | |
| 8,471,746 B2 | 6/2013 | Kurunezi et al. | |
| 8,491,759 B2 | 7/2013 | Pipitone et al. | |
| 8,742,669 B2 | 6/2014 | Carter et al. | |
| 8,779,662 B2 | 7/2014 | Boston | |
| 8,803,424 B2 | 8/2014 | Boston | |
| 8,884,180 B2 | 11/2014 | Ilie | |
| 8,896,391 B2 | 11/2014 | du Toit | |
| 8,928,229 B2 | 1/2015 | Boston | |
| 9,042,121 B2 | 5/2015 | Walde et al. | |
| 9,065,426 B2 | 6/2015 | Mason et al. | |
| 9,105,447 B2 | 8/2015 | Brouk et al. | |
| 9,111,725 B2 | 8/2015 | Boston | |
| 9,124,248 B2 | 9/2015 | Van Zyl et al. | |
| 9,142,388 B2 | 9/2015 | Hoffman et al. | |
| 9,148,086 B2 | 9/2015 | Fife et al. | |
| 9,166,481 B1 | 10/2015 | Vinciarelli | |
| 9,171,700 B2 | 10/2015 | Gilmore | |
| 9,196,459 B2 | 11/2015 | Bhutta | |
| 9,208,992 B2 | 12/2015 | Brouk et al. | |
| 9,215,788 B2 * | 12/2015 | Karni | H05H 1/2406 |
| 9,224,579 B2 | 12/2015 | Finley et al. | |
| 9,225,299 B2 | 12/2015 | Mueller et al. | |
| 9,287,098 B2 | 3/2016 | Finley et al. | |
| 9,294,100 B2 | 3/2016 | Van Zyl et al. | |
| 9,306,533 B1 | 4/2016 | Mavretic | |
| 9,313,870 B2 | 4/2016 | Walde et al. | |
| 9,337,804 B2 | 5/2016 | Mason et al. | |
| 9,345,122 B2 | 5/2016 | Bhutta | |
| 9,385,021 B2 | 7/2016 | Chen | |
| 9,418,822 B2 | 8/2016 | Kaneko | |
| 9,478,397 B2 | 10/2016 | Blackburn et al. | |
| 9,483,066 B2 | 11/2016 | Finley et al. | |
| 9,490,353 B2 | 11/2016 | Van Zyl et al. | |
| 9,496,122 B1 | 11/2016 | Bhutta | |
| 9,520,269 B2 | 12/2016 | Finley et al. | |
| 9,524,854 B2 | 12/2016 | Hoffman et al. | |
| 9,525,412 B2 | 12/2016 | Mavretic | |
| 9,536,713 B2 | 1/2017 | Van Zyl et al. | |
| 9,543,122 B2 | 1/2017 | Bhutta | |
| 9,544,987 B2 | 1/2017 | Mueller et al. | |
| 9,558,917 B2 | 1/2017 | Finley et al. | |
| 9,577,516 B1 | 2/2017 | Van Zyl et al. | |
| 9,578,731 B2 | 2/2017 | Van Zyl | |
| 9,584,090 B2 | 2/2017 | Mavretic | |
| 9,589,767 B2 | 3/2017 | Hoffman et al. | |
| 9,591,739 B2 | 3/2017 | Bhutta | |
| 9,620,340 B2 | 4/2017 | Finley et al. | |
| 9,651,957 B1 | 5/2017 | Finley et al. | |
| 9,660,613 B2 | 5/2017 | Van Zyl et al. | |
| 9,673,028 B2 | 6/2017 | Walde et al. | |
| 9,697,911 B2 | 7/2017 | Bhutta | |
| 9,711,331 B2 | 7/2017 | Mueller et al. | |
| 9,711,335 B2 | 7/2017 | Christie et al. | |
| 9,728,378 B2 | 8/2017 | Bhutta et al. | |
| 9,729,122 B2 | 8/2017 | Mavretic | |
| 9,741,544 B2 | 8/2017 | Van Zyl et al. | |
| 9,745,660 B2 | 8/2017 | Bhutta | |
| 9,748,076 B1 | 8/2017 | Choi et al. | |
| 9,755,641 B1 | 9/2017 | Bhutta | |
| 9,773,644 B2 | 9/2017 | Van Zyl et al. | |
| 9,807,863 B1 | 10/2017 | Van Zyl et al. | |
| 9,812,305 B2 | 11/2017 | Pelleymounter et al. | |
| 9,844,127 B2 | 12/2017 | Bhutta | |
| 9,852,890 B2 | 12/2017 | Mueller et al. | |
| 9,854,659 B2 | 12/2017 | Van Zyl et al. | |
| 9,865,432 B1 | 1/2018 | Bhutta | |
| 9,952,297 B2 | 4/2018 | Wang | |
| 10,008,317 B2 | 6/2018 | Iyer | |
| 10,020,752 B1 | 7/2018 | Vinciarelli | |
| 10,026,592 B2 | 7/2018 | Chen | |
| 10,026,594 B2 | 7/2018 | Bhutta | |
| 10,026,595 B2 | 7/2018 | Choi et al. | |
| 10,074,518 B2 | 9/2018 | Van Zyl et al. | |
| 10,139,285 B2 | 11/2018 | Murray et al. | |
| 10,141,788 B2 | 11/2018 | Karnstedt | |
| 10,194,518 B2 | 1/2019 | Van Zyl et al. | |
| 10,217,618 B2 | 2/2019 | Larson et al. | |
| 10,224,184 B2 | 3/2019 | Van Zyl et al. | |
| 10,224,186 B2 | 3/2019 | Polak et al. | |
| 10,263,577 B2 | 4/2019 | Van Zyl et al. | |
| 10,269,540 B1 | 4/2019 | Carter et al. | |
| 10,314,156 B2 | 6/2019 | Van Zyl et al. | |
| 10,332,730 B2 | 6/2019 | Christie et al. | |
| 10,340,879 B2 | 7/2019 | Mavretic | |
| 10,373,811 B2 | 8/2019 | Christie et al. | |
| 10,374,070 B2 | 8/2019 | Wood | |
| 10,410,836 B2 | 9/2019 | McChesney | |

(56) References Cited

U.S. PATENT DOCUMENTS

| | | | |
|---|---|---|---|
| 10,411,769 B2 | 9/2019 | Bae | |
| 10,447,174 B1 | 10/2019 | Porter, Jr. et al. | |
| 10,469,108 B2 | 11/2019 | Howald | |
| 10,475,622 B2 | 11/2019 | Pankratz et al. | |
| 11,107,661 B2* | 8/2021 | Oliveti | H03H 7/40 |
| 11,114,279 B2* | 9/2021 | Oliveti | H01J 37/32183 |
| 2002/0004309 A1* | 1/2002 | Collins | H01J 37/32146 |
| | | | 438/719 |
| 2003/0052085 A1* | 3/2003 | Parsons | H01J 37/32082 |
| | | | 118/712 |
| 2003/0121609 A1 | 7/2003 | Ohmi et al. | |
| 2003/0150710 A1 | 8/2003 | Evans et al. | |
| 2003/0230984 A1 | 12/2003 | Kitamura et al. | |
| 2004/0016402 A1 | 1/2004 | Walther et al. | |
| 2004/0026235 A1 | 2/2004 | Stowell, Jr. | |
| 2005/0034811 A1 | 2/2005 | Mahoney et al. | |
| 2005/0045475 A1 | 3/2005 | Watanabe | |
| 2005/0270805 A1 | 12/2005 | Yasumura | |
| 2006/0005928 A1 | 1/2006 | Howald | |
| 2006/0169582 A1 | 8/2006 | Brown et al. | |
| 2006/0169584 A1 | 8/2006 | Brown et al. | |
| 2006/0189976 A1* | 8/2006 | Karni | H05H 1/2406 |
| | | | 606/41 |
| 2006/0249729 A1 | 11/2006 | Mundt et al. | |
| 2007/0121267 A1 | 5/2007 | Kotani | |
| 2007/0222428 A1 | 9/2007 | Garvin et al. | |
| 2008/0061793 A1 | 3/2008 | Anwar et al. | |
| 2008/0061901 A1 | 3/2008 | Gilmore | |
| 2008/0087381 A1 | 4/2008 | Shannon et al. | |
| 2008/0197854 A1 | 8/2008 | Valcore et al. | |
| 2008/0272875 A1 | 11/2008 | Huang et al. | |
| 2008/0317974 A1 | 12/2008 | de Vries | |
| 2009/0026964 A1 | 1/2009 | Knaus | |
| 2009/0206974 A1 | 8/2009 | Meinke | |
| 2010/0012029 A1 | 1/2010 | Forester et al. | |
| 2010/0072172 A1 | 3/2010 | Ui et al. | |
| 2010/0096261 A1 | 4/2010 | Hoffman et al. | |
| 2010/0098882 A1 | 4/2010 | Lubomirsky et al. | |
| 2010/0159120 A1 | 6/2010 | Dzengeleski et al. | |
| 2011/0121735 A1 | 5/2011 | Penny | |
| 2011/0140607 A1 | 6/2011 | Moore et al. | |
| 2011/0148303 A1 | 6/2011 | Van Zyl et al. | |
| 2011/0174777 A1 | 7/2011 | Jensen et al. | |
| 2012/0097104 A1 | 4/2012 | Pipitone et al. | |
| 2012/0097524 A1 | 4/2012 | Pipitone et al. | |
| 2012/0145322 A1 | 6/2012 | Gushiken et al. | |
| 2012/0164834 A1 | 6/2012 | Jennings et al. | |
| 2012/0262064 A1 | 10/2012 | Nagarkatti | |
| 2013/0002136 A1 | 1/2013 | Blackburn et al. | |
| 2013/0140984 A1 | 6/2013 | Hirayama | |
| 2013/0180964 A1 | 7/2013 | Ilic | |
| 2013/0214683 A1 | 8/2013 | Valcore et al. | |
| 2013/0240482 A1 | 9/2013 | Nam et al. | |
| 2013/0278140 A1 | 10/2013 | Mudunuri et al. | |
| 2013/0345847 A1 | 12/2013 | Valcore et al. | |
| 2014/0225504 A1 | 8/2014 | Kaneko | |
| 2014/0239813 A1 | 8/2014 | Van Zyl | |
| 2014/0265911 A1 | 9/2014 | Kamata et al. | |
| 2014/0328027 A1 | 11/2014 | Zhang et al. | |
| 2014/0367043 A1 | 12/2014 | Bishara et al. | |
| 2015/0002020 A1 | 1/2015 | Boston | |
| 2015/0115797 A1 | 4/2015 | Yuzurihara | |
| 2015/0150710 A1 | 6/2015 | Evans et al. | |
| 2015/0313000 A1 | 10/2015 | Thomas et al. | |
| 2016/0002020 A1 | 1/2016 | Orita | |
| 2016/0248396 A1 | 8/2016 | Mavretic | |
| 2016/0308560 A1 | 10/2016 | Howald et al. | |
| 2017/0018349 A1 | 1/2017 | Otsubo et al. | |
| 2017/0133886 A1 | 5/2017 | Kurs et al. | |
| 2017/0338081 A1 | 11/2017 | Yamazawa | |
| 2017/0345620 A1 | 11/2017 | Coumou et al. | |
| 2018/0034446 A1 | 1/2018 | Wood | |
| 2018/0102238 A1 | 4/2018 | Gu et al. | |
| 2018/0261431 A1 | 9/2018 | Hammond, IV et al. | |
| 2019/0172683 A1 | 6/2019 | Mavretic | |
| 2019/0199241 A1 | 6/2019 | Satoshi et al. | |
| 2019/0385822 A1 | 12/2019 | Marakhtanov et al. | |
| 2020/0168439 A1* | 5/2020 | Bhutta | H03H 7/38 |
| 2020/0169230 A1* | 5/2020 | Gruner | H03F 3/211 |
| 2020/0411290 A1* | 12/2020 | Oliveti | H01J 37/32183 |
| 2020/0412322 A1* | 12/2020 | Ouyang | H01J 37/32183 |
| 2021/0013009 A1* | 1/2021 | Oliveti | H03H 7/40 |
| 2021/0175050 A1* | 6/2021 | Van Zyl | H01J 37/32165 |
| 2021/0320594 A1* | 10/2021 | Van Zyl | H03H 7/52 |
| 2021/0327684 A1* | 10/2021 | Bhutta | H03H 7/38 |
| 2021/0386294 A1* | 12/2021 | Oliveti | H01J 37/32183 |
| 2021/0391148 A1* | 12/2021 | Oliveti | H01J 37/32183 |
| 2022/0189740 A1* | 6/2022 | Oliveti | H01J 37/32183 |
| 2022/0254610 A1* | 8/2022 | Bhutta | H01J 37/32183 |
| 2022/0270859 A1* | 8/2022 | Poghosyan | G01R 29/0878 |

FOREIGN PATENT DOCUMENTS

| | | |
|---|---|---|
| JP | 2006-310245 A | 6/2008 |
| JP | 2010-016124 A | 1/2010 |
| JP | 2015-502213 A | 1/2015 |
| KR | 10-2006-0067957 A | 6/2006 |
| KR | 10-2014-0077866 A | 6/2014 |
| KR | 10-2017-0127724 A | 11/2017 |
| KR | 10-2018-0038596 A | 4/2018 |
| WO | 2012054305 | 4/2012 |
| WO | 2012054306 | 4/2012 |
| WO | 2012054307 | 4/2012 |
| WO | 2016048449 A1 | 3/2016 |
| WO | 2016097730 | 6/2016 |
| WO | 2019096564 A1 | 5/2019 |
| WO | 2019147513 A1 | 8/2019 |
| WO | 2019-244734 A1 | 12/2019 |
| WO | WO-2020263726 A1 * | 12/2020 ........ H01J 37/32183 |

OTHER PUBLICATIONS

Stowell, et al., "RF-superimposed DC and pulsed DC sputtering for deposition of transparent conductive oxides", Thin Solid Films 515 (2007), pp. 7654-7657.

Bender, et al., "Characterization of a RF=dc-magnetron discharge for the sputter deposition of transparent and highly conductive ITO films", Appl. Phys. A 69, (1999), pp. 397-409.

Economou, Demetre J., "Fundamentals and application of ion-ion plasmas", Applied Surface Science 253 (2007), pp. 6672-6680.

Godyak et al., "Plasma parameter evolution in a periodically pulsed ICP", XXVIIth, Eindhoven, the Netherlands, Jul. 18-22, 2005, 4 pages.

Banna, et al., "Inductively Coupled Pulsed Plasmas in the Presence of Synchronous Pulsed Substrate Bias for Robust, Reliable, and Fine Conductor Etching", IEEE Transactions on Plasma Science, vol. 37, No. 9, Sep. 2009, pp. 1730-1746.

Kushner, Mark J., "Pulsed Plasmas as a Method to Improve Uniformity During Materials Processing", Journal of Applied Physics, Jul. 1, 2004, vol. 96, No. 1, pp. 82-93.

LTM Technologies, M. Haass "Synchronous Plasma Pulsing for Etch Applications", Apr. 3, 2010 16 pages.

PCT/US2020/038892—International Search Report and Written Opinion of the International Searching Authority, dated Oct. 6, 2020, 3 pages.

PCT/US2020/038899—International Search Report and Written Opinion of the International Searching Authority, dated Sep. 26, 2019, 5 pages.

PCT/US2021/012847—International Search Report and Written Opinion of the International Searching Authority, dated May 6, 2021, 11 pages.

PCT/US2021/012849 International Search Report and Written Opinion of the International Searching Authority, dated May 10, 2021, 11 pages.

PCT/US2021/012851 International Search Report and Written Opinion of the International Searching Authority, dated May 6, 2021, 10 pages.

* cited by examiner

ARC SUPPRESSION DEVICE FOR PLASMA PROCESSING EQUIPMENT

CROSS REFERENCE TO RELATED APPLICATIONS

This application is a continuation application of, incorporates by reference, and claims priority to co-pending U.S. patent application Ser. No. 16/456,598 having the same inventorship and title as the instant application, which is incorporated by reference herein for all applicable purposes.

BACKGROUND

Plasma arc events which occur during plasma vapor deposition processes can cause yield-reducing defects in the fabrication of integrated circuits on semiconductor wafers. Plasma arc events often result in flashes of light and heat that resemble a type of electrical discharge that results from a low-impedance connection through air to ground or other voltage phase in an electrical system. Furthermore, a plasma arc event can also cause a rapid release of energy due to fault events between phase conductors, phase conductors and neutral conductors, or between phase conductors and ground points.

BRIEF DESCRIPTION OF THE DRAWINGS

For a more complete understanding of the present disclosure, examples in accordance with the various features described herein may be more readily understood with reference to the following detailed description taken in conjunction with the accompanying drawings, where like reference numerals designate like structural elements.

DETAILED DESCRIPTION

Figure 1:
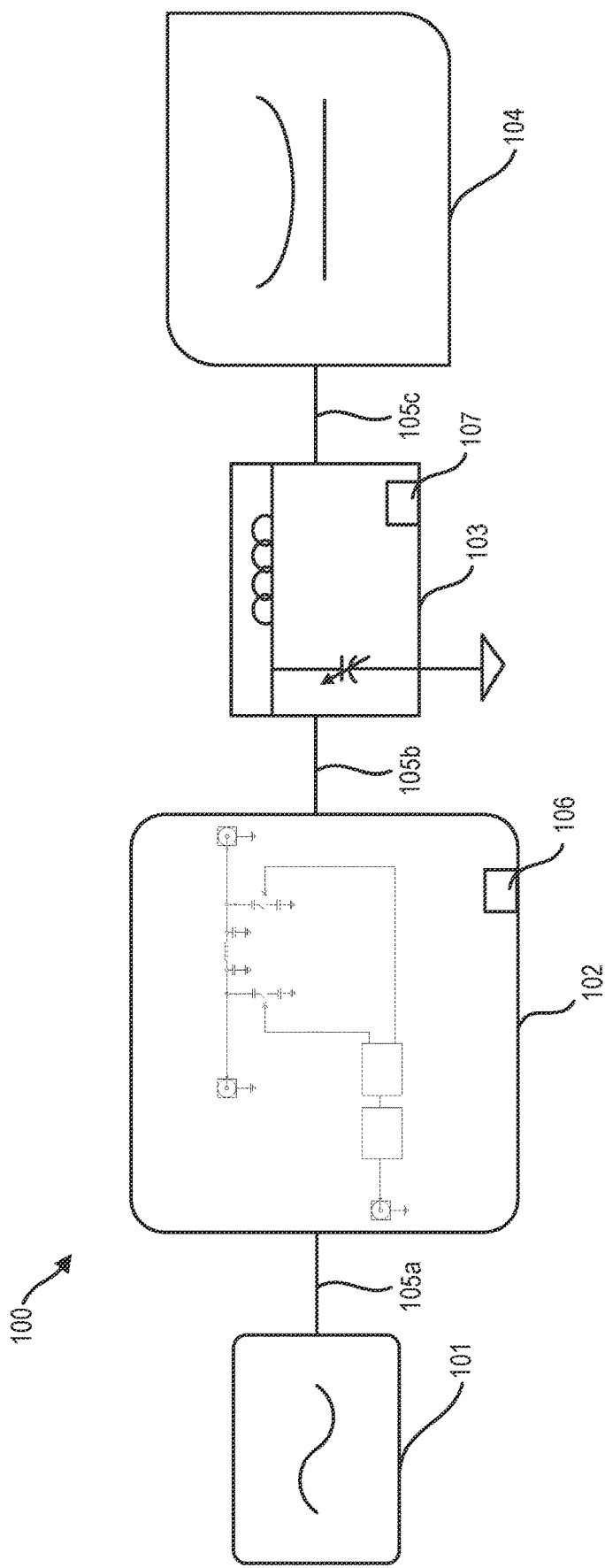
FIG. 1 is an illustration of a plasma generation system which includes an arc suppression device, according to a system and method of the present disclosure.

The description of the different advantageous implementations has been presented for purposes of illustration and is not intended to be exhaustive or limited to the implementations in the form disclosed. Many modifications and variations will be apparent to persons having ordinary skill in the art. Further, different implementations may provide different advantages as compared to other implementations. The implementation or implementations selected are chosen and described in order to best explain the principles of the implementations, the practical application, and to enable persons having ordinary skill in the art to understand the disclosure for various implementations with various modifications as are suited to the particular use contemplated.

Before the present disclosure is described in detail, it is to be understood that, unless otherwise indicated, this disclosure is not limited to specific procedures or articles, whether described or not. It is further to be understood that the terminology used herein is for the purpose of describing particular implementations only and is not intended to limit the scope of the present disclosure.

Plasma processing systems use, for example, radio-frequency ("RF") power to initiate and sustain a plasma, with the RF energy coupled into a gas by an inductive and/or capacitive plasma coupling element. In some implementations, an RF power source supplies RF power to a plasma coupling element (e.g., coil or electrodes) which, in turn, excites the gas into a plasma within a plasma region of a process chamber. The generated plasma is then used to process a substrate (e.g., a semiconductor wafer).

A plasma is often sustained in a portion of its current-voltage characteristic known as the abnormal glow regime. In this regime, since a high density of electrons and ions are present, and because significant electric fields are also present, the plasma is susceptible to plasma arcing ("arcing"). Arcing is a condition in which the region of current flow in a plasma normally spreads over a significant volume and collapses into a highly localized region (called an "arcing region") that contains a concentrated arcing current. During arcing, surfaces of the substrate or the system components can be altered or damaged from ion or electron implantation, from sputtering of the surfaces and/or localized heating which can cause spalling due to the high concentration of power dissipation and the high speeds attained by electrons and ions in the arcing region.

While normal metal deposition is typically less than one micron, arcing can cause a locally thicker deposition of metal on a semiconductor wafer. When arcing occurs, the energy of the electromagnetic field within the plasma chamber can be focused on a smaller region of the target than intended, which can dislodge a solid piece of the target. The dislodged solid piece of target material may be large relative to the thickness of the uniform coating expected on the wafer, and if a large piece falls upon the semiconductor wafer, it may cause a defect in the integrated circuit being formed on the semiconductor wafer at that location.

In RF systems, impedance matching is important to maximize power transfer. Herein, an impedance is defined as the total opposition of a device or circuit to the flow of an alternating current ("AC") at a given frequency and is represented as a complex quantity which can be graphically shown on a vector plane. An impedance vector consists of a real part (resistance, R) and an imaginary part (reactance, X) and can be expressed using the rectangular-coordinate form: Z=R+Xj. As known in the art, reactance varies with frequency when the effect of resistance is constant regardless of frequency.

In electronics, impedance matching is the practice of transforming the relationship between voltage and current in phase and amplitude such that the input impedance of an electrical load or the output impedance of its corresponding signal source maximizes power transfer or minimizes signal reflection from the load. A primary role in any impedance-matching scheme is to force a load impedance to appear as the complex conjugate of the source impedance such that maximum power can be transferred to the load. Any reactance between the source resistance and the load resistance reduces the current in the load resistance and with it the power dissipated in the load resistance. To restore the dissipation to the maximum that occurs when the source resistance equals the load resistance, the net reactance of the transmission loop is equal to zero. This occurs when the load and source impedances are made to be complex conjugates of another so they have the same real parts and opposite type reactive parts. If the source impedance is Zs=R+Xj, then the complex conjugate would be Zs*=R−Xj.

The present disclosure provides an impedance transformer (e.g., a 90-degree (i.e., 90°) or quarter-wave impedance transformer) to be used in conjunction with a pair of resistive terminations to transform an impedance caused by a plasma arc event (e.g., arcing). An impedance transformer may include a coaxial transmission line, a broadside coupled transmission line, an embedded transmission line, or a waveguide. However, these are merely examples and the present disclosure is not limited thereto.

An impedance transformer may be realized by inserting a section of a transmission line with appropriate electrical length and characteristic impedance. For example, a quarter-wave impedance transformer may be used to match real impedances. However, a complex load impedance can also be transformed to a real impedance by adding a series or shunt reactive component. Notably, a quarter-wave transformer can provide a match at a particular operating frequency as well as an acceptable match across a bandwidth of one octave, or less, depending on the quality factor, Q, of the transformation and the application.

The present disclosure provides a plasma generation system utilizing plasma for processing a substrate such as a semiconductor wafer. Notably, the present disclosure provides a novel arc suppression device which can respond to an electrical signal when arcing occurs and can further reduce the energy being supplied to a plasma chamber when the signal is received. In addition, the arc suppression device disclosed herein can reduce the reflection coefficient (e.g., gamma) as seen by a RF generator in a power delivery system.

FIG. 1 is an illustration of a plasma generation system 100 which includes an arc suppression device 102, according to a system and method of the present disclosure. As shown, in addition to the arc suppression device 102, the plasma generation system 100 includes a RF generator 101, a matching network 103, and a plasma chamber 104, all coupled by a series of transmission lines 105a-105c.

The RF generator 101 provides power to be delivered via the transmission lines 105a-105c to the plasma chamber 104. The RF generator 101 may operate at many different frequencies. For example, the RF generator 101 may operate at low frequencies (e.g., 30 kHz->300 kHz), medium frequencies (e.g., 300 kHz->3 MHz), high frequencies (e.g., 3 MHz->30 MHz), and very high frequencies (e.g., 30 MHz->300 MHz), according to one or more examples of the present disclosure.

Notably, the present disclosure presents the RF generator 101 with a stable load (e.g., approximately 50 ohms) even during unexpected events (e.g., plasma arcing) which may cause drastic changes to the impedance within the plasma chamber 104. During arcing, an impedance changes rapidly within the plasma chamber 104 which can shift the load-line, and hence, the efficiency and stability of the RF generator 101 thereby causing spurious emissions, etc. Advantageously, the arc suppression device 102 can divert the energy supplied by the RF generator 101 from the process chamber that is feeding the plasma arc, thereby suppressing, or at least, mitigating the arc event. The arc suppression device 102 may be equipped with sensor(s) (e.g., optical or electrical sensors) 106 which determine when arcing occurs and provides a triggering signal or triggering signals to the arc suppression device 102 when arcing is detected.

Advantageously, as will be explained in more detail below, the arc suppression device 102 may include a set of switching elements which can react quickly such that the arc suppression device 102 can react on the order of microseconds or less. The set of switching elements may include a PIN diode, silicon carbide field effect transistor ("SiCFET"), metal oxide semiconductor field effect transistor ("MOSFET"), insulated-gate bipolar transistor ("IGBT"), or bipolar junction transistor ("BJT"). It should be understood, however, that the present disclosure is not limited to the aforementioned examples of switching elements. In addition, some implementations may have the switching elements 210,211 ganged together or operated individually.

It should be understood by a person having ordinary skill in the art with the benefit of this disclosure that the actual impedance within the plasma chamber 104 is not practically measured accurately along the transmission lines 105a-105c during a process operation. The system described in this disclosure may operate effectively regardless of the load impedance.

The matching network 103 may include a plurality of reactive elements; and a controller 107 configured to provide a respective control signal to each of the actuating devices for the plurality of reactive elements. In response to the respective control signal provided thereto, each reactive element is actuated in accordance with that control signal. The matching network 103 can take the impedance presented by the plasma chamber 104 and transform it to a desired source impedance (e.g., 50 ohms). However, it is common for automatic impedance matching networks used in plasma processing systems to used tunable elements driven by a motor. It may take the matching network 103 hundredths of milliseconds, or more, to react to sharp changes in load impedance. In some cases, the matching network 103 may be unable to tune acutely if the event has resulted in load impedances outside of the range of the matching network.

Figure 2:
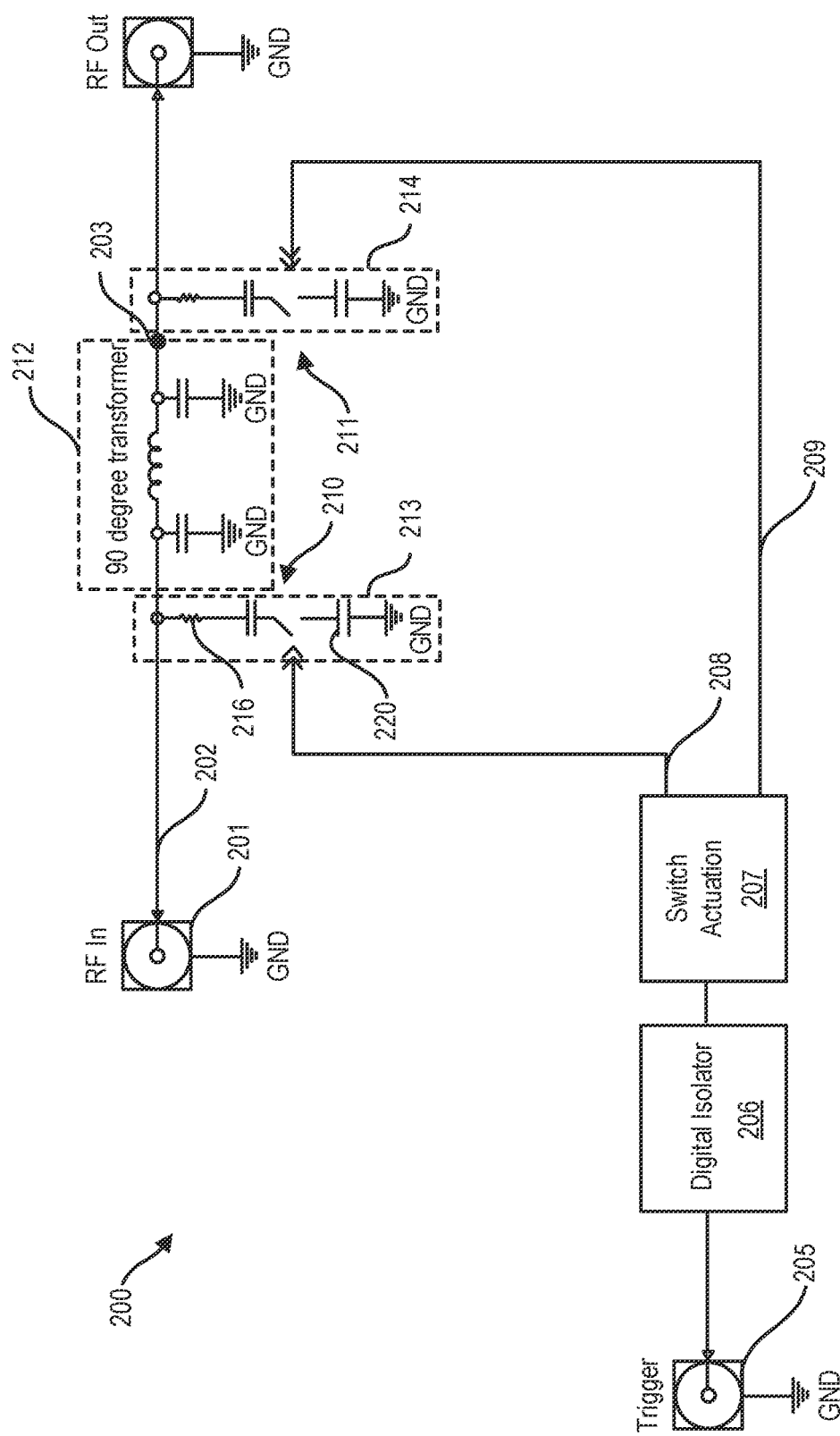
FIG. 2 is an illustration of an arc suppression device, according to a system and method of the present disclosure. In some examples, the arc suppression device of FIG. 2 may be used to implement the arc suppression device of the plasma generation system of FIG. 1.

FIG. 2 is an illustration of an arc suppression device 200, according to a system and method of the present disclosure. In some examples, the arc suppression device 200 may be connected to a RF power port 201 along a transmission line 202. The arc suppression device 200 includes two shunt networks (e.g., elements) 213, 214 and a 90-degree, pi-network impedance transformer 212. In one implementation, each shunt network 213, 214 includes a power dissipater 216 (e.g., a resistor), one or more capacitive elements 220, and a switching element 210, 211. The 90-degree, pi-network impedance transformer 212 may be coupled to the power dissipater 216 to perform an impedance transformation, that when the set of switching elements are engaged in conjunction with the power dissipater 216, reduces the reflection coefficient at the input of the device 200. In one implementation, the reflection coefficient is reduced to a range of 0-0.5 (e.g., VSWR no greater than 3:1)

In one implementation, shunt network 214 takes the impedance present at node 203 (e.g., impedance within a plasma chamber) and places this impedance in parallel therewith. The 90-degree, pi-network impedance transformer 212 then transforms the resulting impedance 90 degrees. Lastly, the shunt network 213 takes the impedance transformed by the 90-degree, pi-network impedance transformer 212 and places this impedance in parallel therewith.

The arc suppression device 200 can transform a high impedance to a low impedance, and vice versa, to within a target VSWR (e.g., 3:1). Moreover, the arc suppression device 200 can transform an impedance with a negative phase angle to an impedance with a positive phase angle, and vice versa, within a target VSWR.

It should be understood by a person having ordinary skill in the art that the arc suppression device 200 is not limited to a pair of shunt networks 213, 214. In some implementations, a pair of shunt networks 213, 214 may be replaced with a series configuration.

The power dissipater 216 may include a resistive element that is non-inductive. The power dissipater 216, when engaged by the switching elements 210, 211, dissipates both stored and delivered energy within the system. In the implementation shown, the power dissipater 216 has a value of 130 ohms whereas the capacitive element has a value of approximately 0.01 ρF. However, these values are merely exemplary and do not limit the present disclosure. The value of the power dissipater 216 determines the degree of energy that is dissipated and the amount that the reflection coefficient seen by the RF generator is minimized.

The arc suppression device 200 includes three primary components: a switching element (e.g., switching elements 210, 211) to engage (e.g., close) or disengage (e.g., open), an impedance transformer (e.g., 90-degree, pi-network impedance transformer 212) which can invert the impedance presented by the plasma chamber (e.g., plasma chamber 104 in FIG. 1), and a power dissipater (e.g., power dissipater 216) to divert and dissipate the stored energy from the plasma chamber.

In one implementation, the switching elements 210, 211 engage upon a triggering signal or triggering signals. For example, the triggering signal may be the result of a change in reflection coefficient of at least 0.5. However, the present disclosure is not limited thereto. In addition, a triggering signal may be a change in current, voltage, or reflection coefficient which exceeds a pre-determined threshold over some period of time. Furthermore, the triggering signal may be a composite of multiple sensed signals distributed throughout the plasma generation system.

A triggering signal may be provided to the arc suppression device 200 by the RF generator. In addition, the radio frequency plasma chamber may include a sensor that determines when an arc event occurs and provide a triggering signal to the arc suppression device 200 when the arc event has been detected.

The switching elements 210, 211 may be mounted to the arc suppression device 200 by a heatsink (not shown). In addition, the switching elements 210, 211 may react to the triggering signal on an order of microseconds or less. In addition, when the switching elements 210, 211 engage, the arc suppression device 200 network transforms the plasma load impedance to some new impedance with a low reflection coefficient to the RF power port 201 regardless of plasma load impedance and dissipates stored energy from the plasma processing module, according to some implementations. Alternatively, when the switching elements 210, 211 disengage, the arc suppression device 200 appears as a filter with 50-ohm input and output impedance. When the switching elements 210, 211 disengage, the switching elements 210, 211 prevent current from flowing into the power dissipaters 216 and capacitive elements 220 so the shunt networks 213/214 appear as an open circuit. In one implementation, each of the switching elements 210, 211 is a symmetric FET switch which includes silicon carbide field effect transistors ("SiCFET") with floating gate drive circuitry for medium frequency ("MF") RF power systems.

In other implementations, the switching elements 210, 211 include PIN diodes with a high voltage, bipolar-bias power supply. In addition, the switching elements 210, 211 may include SiCFETs, metal oxide semiconductor field effect transistors ("MOSFETS"), insulated-gate bipolar transistors ("IGBT"), or bipolar junction transistors ("BJTs") so as long as doing so does not depart from the spirit and scope of the present disclosure. Switching elements 210, 211, as shown in the figure, can isolate or connect terminations to ground.

The switching elements 210, 211 may be engaged by switch actuator 207 via transmission lines 208, 209. Switch actuator 207 may be also coupled to a digital isolator 206 which provides electrical and/or galvanic isolation between high-voltage RF waveforms in the RF power generation system and the triggering signal. The digital isolator 206 can be coupled to a trigger 205 as further shown in FIG. 2.

As mentioned above, the arc suppression device 200 may include a network that performs a quarter-wave impedance transformation to make use of both dissipative terminations. The network takes the parallel combination of the input impedance of the match, which is the plasma load impedance transformed by the matching network, and the first termination and rotates it by a quarter wavelength so that the RF generator is presented an impedance equal to the parallel combination of this new impedance and the second termination. This mechanism guarantees a minimization of gamma seen by the RF generator and is a function of the characteristic impedance of the system, the characteristic impedance of the transformer (e.g., typically the same impedance), and the termination resistance. A quarter-wave impedance transformer may be defined as a transmission line or waveguide of length one-quarter wavelength (λ) with some known characteristic impedance. The quarter-wave impedance transformer can present at its input node 203 the dual of the impedance with which it is terminated. In this implementation, it is preferable for some VHF and higher frequency applications where lumped elements are exceedingly small and difficult to construct with high current and voltage capability.

In one implementation, the 90-degree, impedance transformer 212 includes a lumped element pi-network (e.g. 90-degree pi-network transformer). The pi-network performs the same impedance transformation as the transmission line or waveguide but offers a much more limited bandwidth. In one implementation, a pi-network of lumped elements consists of capacitors in shunt network branches in addition to an inductor in a series branch. This implementation is preferable for MF and HF applications where the wavelength is exceedingly long.

In one example, the magnitude of the impedance presented by a plasma chamber (e.g., plasma chamber 104 in FIG. 1) may have become a low impedance, and the impedance, $Z_N$, may be placed in parallel with the power dissipation element (e.g., power dissipater 216) of a shunt network by engaging the switch devices. As such, the first power dissipater will not have a large impact on the resulting impedance (e.g., $Z_1=Z_{L1}/Z_N$). The resulting impedance, $Z_1$, is transformed to have a high impedance (e.g., $Z_D$) by the 90-degree, pi-network impedance transformer. The transformed impedance, $Z_D$, is then placed in parallel with the shunt network 214 (e.g., $Z_M=Z_{L2}/Z_D$) which conforms the impedance towards the center of the Smith Chart (e.g., near a source impedance of 50 ohms). In some implementations, a combination of switching elements 210, 211 can be flange-mounted on a water-cooled heatsink for high-power applications.

Alternatively, if the magnitude of the plasma impedance has become high within a plasma chamber (e.g., plasma chamber 104 in FIG. 1), the impedance, $Z_N$, is placed in parallel with a power dissipater 216 of a shunt network 213, 214 (e.g., $Z_2=Z_{L1}/Z_N$). Therefore, the resulting impedance, $Z_2$, conforms to the center as a high impedance is placed in parallel with another high impedance. Further, the 90-degree, pi-network impedance transformer 212 can transform the impedance to a relative low impedance (e.g., $Z_D$). Afterwards, the transformed impedance, $Z_D$, is then placed in parallel with a power dissipater 216 of the shunt network 213 (e.g., $Z_M=Z_{L2}/Z_D$). The shunt network 213 may have low impact on the resulting impedance.

Figure 3:
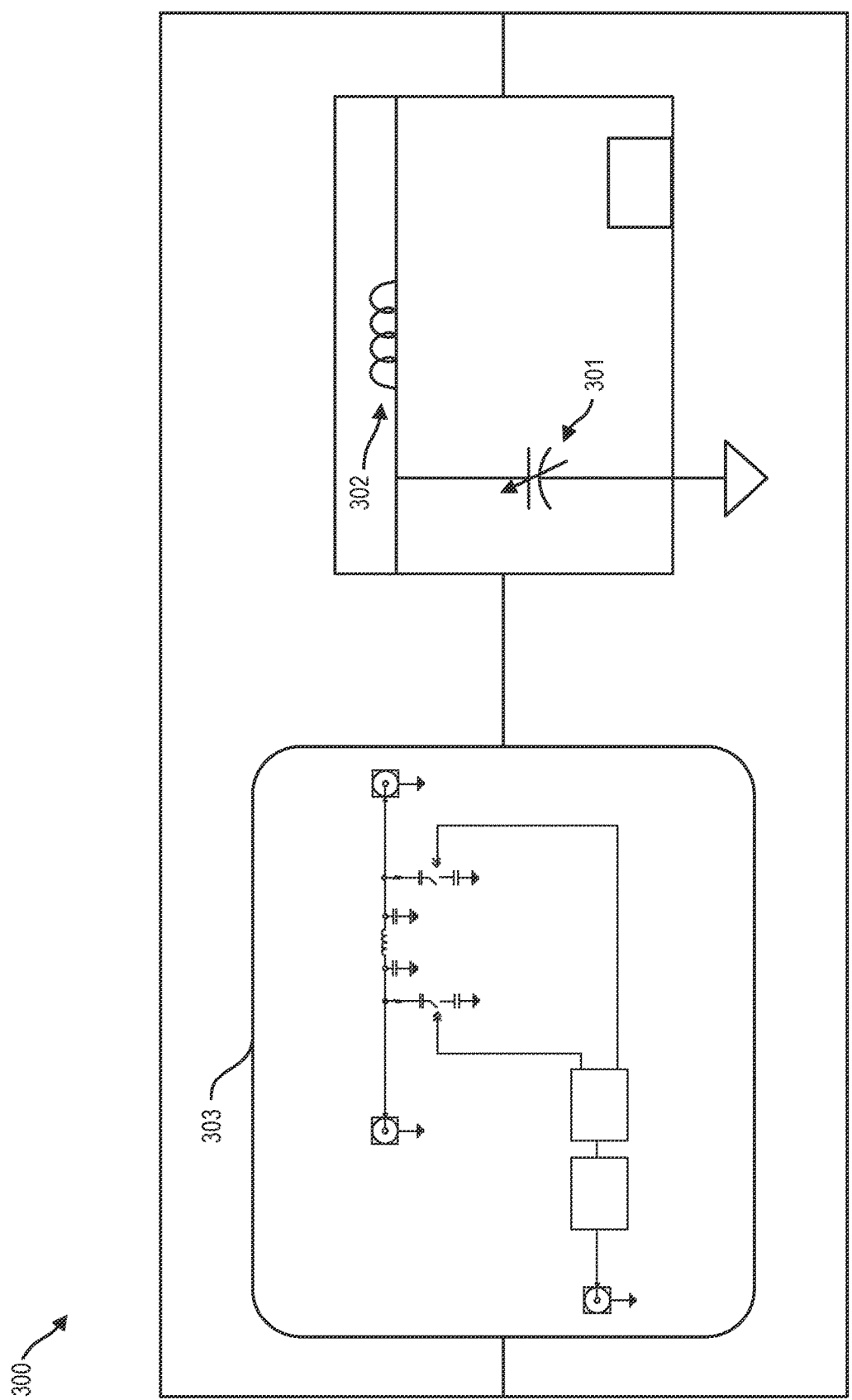
FIG. 3 is an illustration of a matching network which includes an arc suppression device, according to a system and method of the present disclosure.

FIG. 3 is an illustration of a matching network 300 which includes an arc suppression device 305, according to a system and method of the present disclosure. Matching networks may be used, particularly in radio frequency applications, for matching the impedance or admittance of a power source to a load having a different impedance or admittance in order to provide maximum power transfer to the load and to preclude damage to the power source from reflected energy due to the mismatch. Plasma load impedance may vary depending on variables such as generator frequency, delivered power, chamber pressure, gas composition, plasma ignition, in addition to unexpected plasma arc events. The match accounts for these variations in load impedance by varying electrical elements, typically vacuum variable capacitors, internal to the match to maintain the desired input impedance.

Matching network 300 may contain reactive elements, meaning elements that store energy in electrical and magnetic fields as opposed to resistive elements that dissipate electrical power. The most common reactance elements are capacitors, inductors, and coupled inductors but others such as distributed circuits may also be used. Matching networks can also include elements including transmission lines and transformers. In the implementation shown, the matching network 300 contains a single capacitive element 301 and an inductive element 302.

Most notably, the matching network 300 includes an arc suppression device 303. However, it is notable that matching network 300 differs from the matching network 103 shown in FIG. 1 in that the matching network 300 contains an arc suppression device 303 whereas the plasma generation system 100 (see FIG. 1) includes a separate arc suppression device 102 (see FIG. 1) and matching network 103 (see FIG. 1) components. Accordingly, the arc suppression system disclosed herein may be implemented within a matching network in some implementations.

Figure 4:
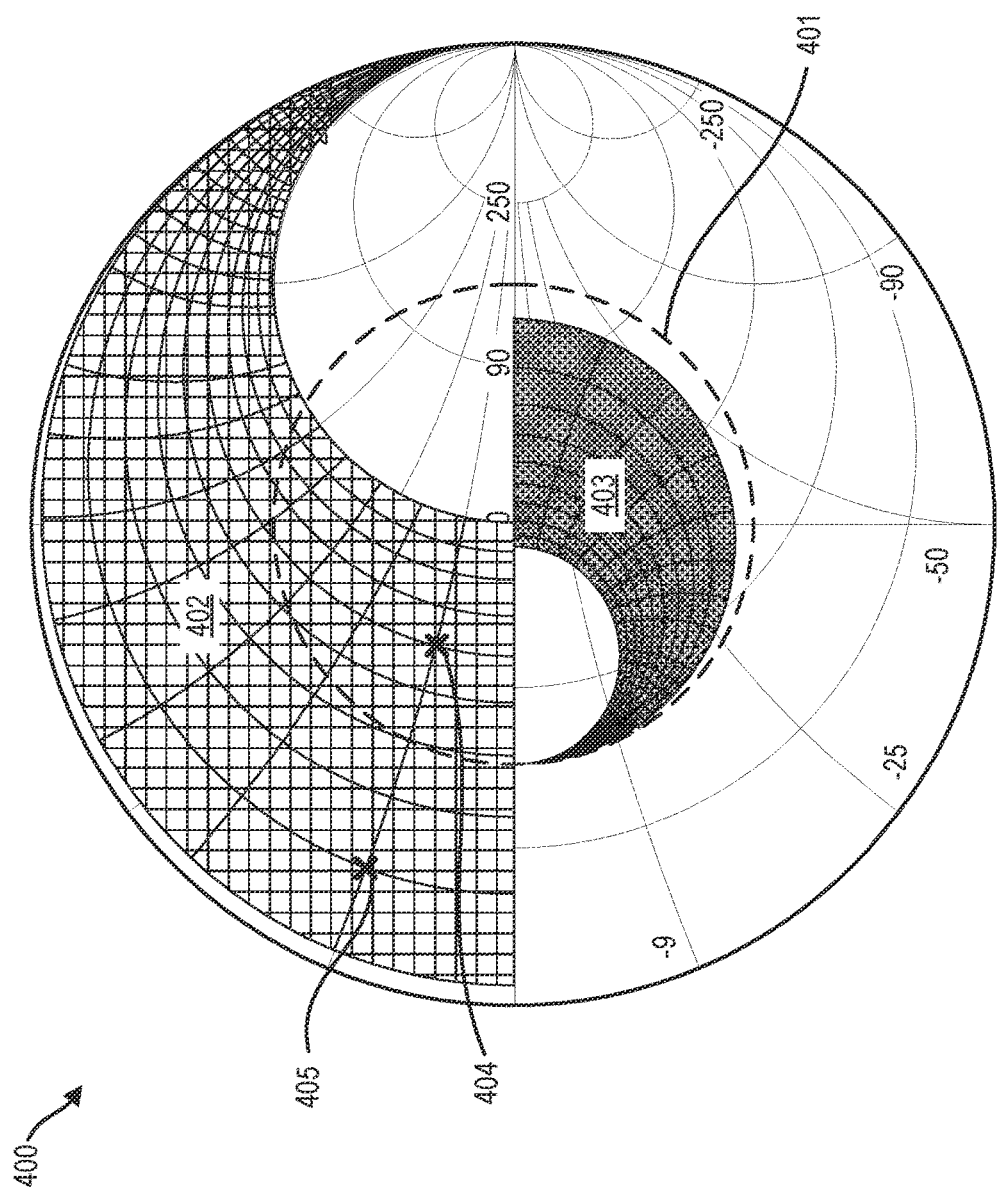
FIG. 4 is a Smith Chart which displays the transformation characteristic of the disclosed system on impedances with low resistive parts and inductive reactive parts.

FIG. 4 is a Smith Chart 400 which displays the transformation characteristic of the disclosed system on impedances with low resistive parts and inductive reactive parts. Accordingly, Smith Chart 400 displays a region 402 of impedances with low resistive parts and inductive reactive parts which can be transformed into impedances that are within a target VSWR 401. When the arc suppression device is engaged, impedances within region 402 will be transformed into the impedances within region 403, which falls within the VSWR 401 as shown in the figure.

It should be understood by a person having ordinary skill in the art that the regions 402, 403 are exemplary as the region 402 impedances with low resistive parts and inductive reactive parts and the transformed region 403 may be greater than or less than that shown in the example of FIG. 4. Herein, an impedance with a low resistive part may be defined as an impedance with a resistance of less than 50 ohms whereas an impedance with a high resistive part may be defined as an impedance with a resistance of greater than 50 ohms. In particular, the transformed region 403 may have a greater or lesser area on the Smith Chart 400 depending upon the target VSWR 401. Moreover, the impedances within the transformed region 403 are capacitive in accordance with implementations which employ an arc suppression device with a 90-degree, pi-network impedance transformer.

In addition, FIG. 4 shows points 404, 405 which are within and outside of the target VSWR 401, respectively. Accordingly, the arc suppression device disclosed herein can transform any impedance with a low resistive part and an inductive reactive part to an impedance within the target VSWR 401 regardless to whether the initial impedance is within or outside of the target VSWR 401.

Figure 5:
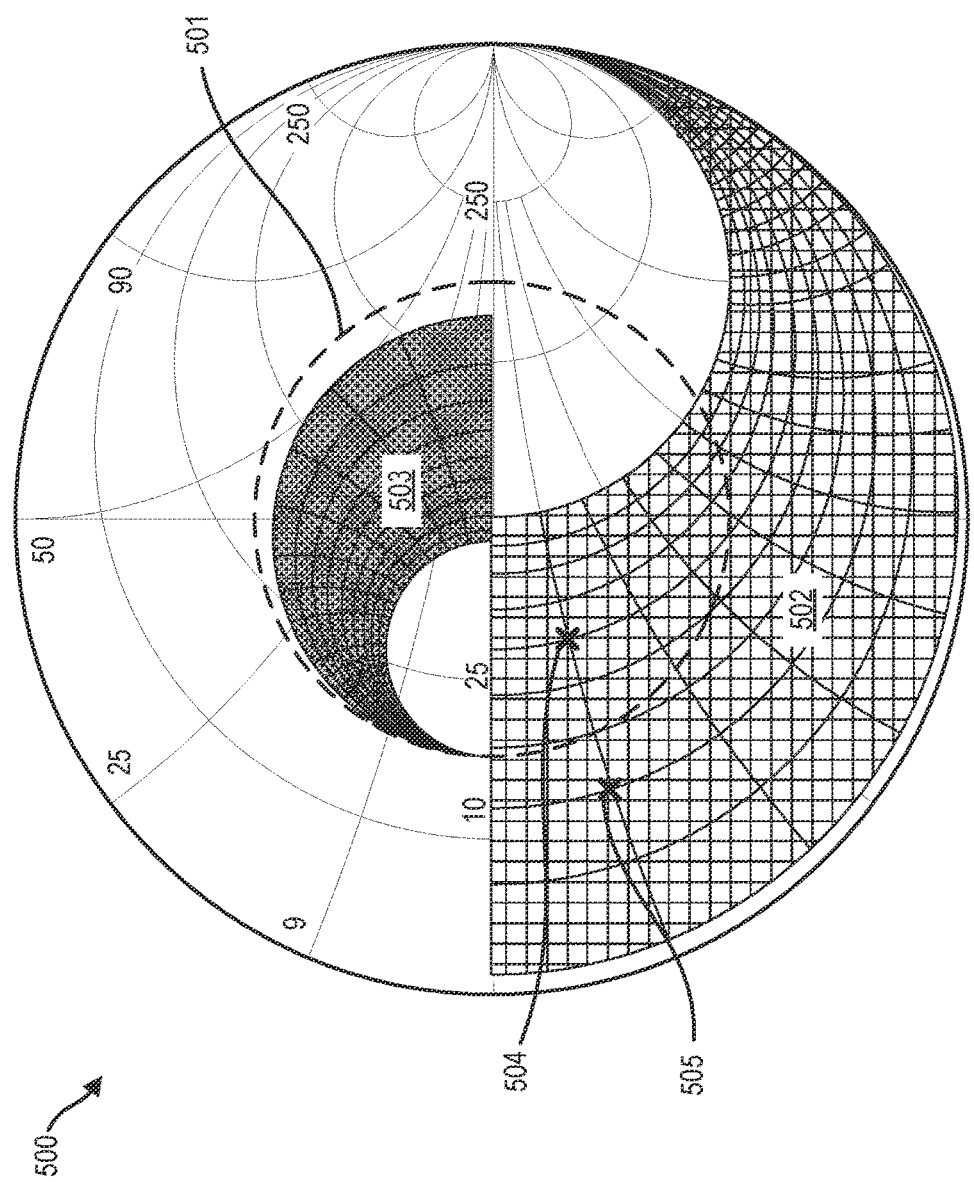
FIG. 5 is a Smith Chart which displays the transformation characteristic of the disclosed system on impedances with low resistive parts and capacitive reactive parts.

FIG. 5 is a Smith Chart 500 which displays the transformation characteristic of the disclosed system on impedances with low resistive parts and capacitive reactive parts. Accordingly, Smith Chart 500 displays a region 502 with low resistive parts and capacitive reactive parts which can be transformed into impedances that are within a target VSWR 501.

A system and method disclosed herein can transform impedances with low resistive part and capacitive reactive parts to acceptable impedances as illustrated by transformed region 503. Regions 502, 503 are exemplary as the region 502 of impedances with low resistive part and capacitive reactive parts and the transformed region 503 may be greater than or less than what is shown in the example of FIG. 5. As such, the transformed region 503 may have a greater or lesser area on the Smith Chart 500 depending upon the target VSWR 501. Moreover, the impedances within the transformed region 503 are inductive in accordance with implementations which employ an arc suppression device with a 90-degree, pi-network impedance transformer.

In addition, FIG. 5 also shows points 504, 505 which are within and outside of the target VSWR 501, respectively. Accordingly, the arc suppression device disclosed herein can transform any impedances with low resistive part and capacitive reactive parts to an impedance within the target VSWR 501 regardless to whether the initial impedance is within or outside of the target VSWR 501.

Figure 6:
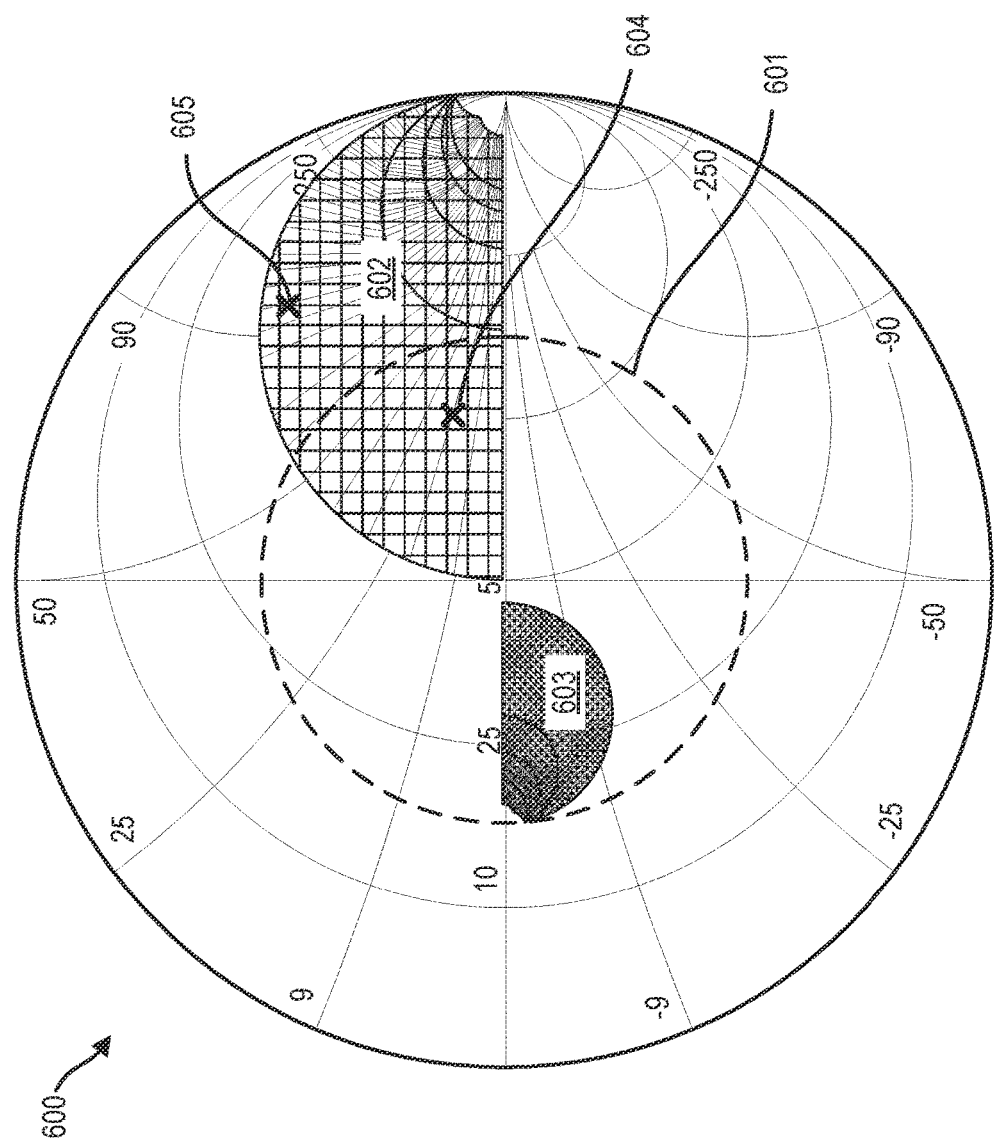
FIG. 6 is a Smith Chart which displays the transformation characteristic of the disclosed system on impedances with high resistive parts and inductive reactive parts.

FIG. 6 is a Smith Chart 600 which displays the transformation characteristic of the disclosed system on impedances with high resistive parts and inductive reactive parts. Accordingly, Smith Chart 600 displays a region 602 of impedances with high resistive parts and inductive reactive parts which can be transformed into impedances that are within a target VSWR 601. Notably, region 602 of impedances with high resistive parts and inductive reactive parts and the region 402 (see FIG. 4) of purely inductive, low impedances as illustrated in FIG. 4 constitute the entire induction impedances collectively on the Smith Chart 600. A person having ordinary skill in the art can appreciate that the top half of a standard Smith Chart represents the inductive region of impedances thereon.

Regions 602, 603 are exemplary as the region 602 of impedances with high resistive parts and inductive reactive parts and the transformed region 603 may be greater than or less than what is shown in the example of FIG. 6. As such, the transformed region 603 may have a greater or lesser area on the Smith Chart 600 depending upon the target VSWR 601.

As described herein, a system and method of the present disclosure can transform impedances with high resistive parts and inductive reactive parts into the transformed region 603 that is within a target VSWR 601. Notably, the impedances within the transformed region 603 are capacitive in accordance with implementations which employ an arc suppression device with a 90-degree, pi-network impedance transformer.

In addition, FIG. 6 shows points 604, 605 which are within and outside of the target VSWR 601, respectively. Accordingly, the arc suppression device disclosed herein can transform any impedance with a high resistive part and inductive reactive part to an impedance within the target VSWR 601 regardless to whether the initial impedance is within or outside of the target VSWR 601.

Figure 7:
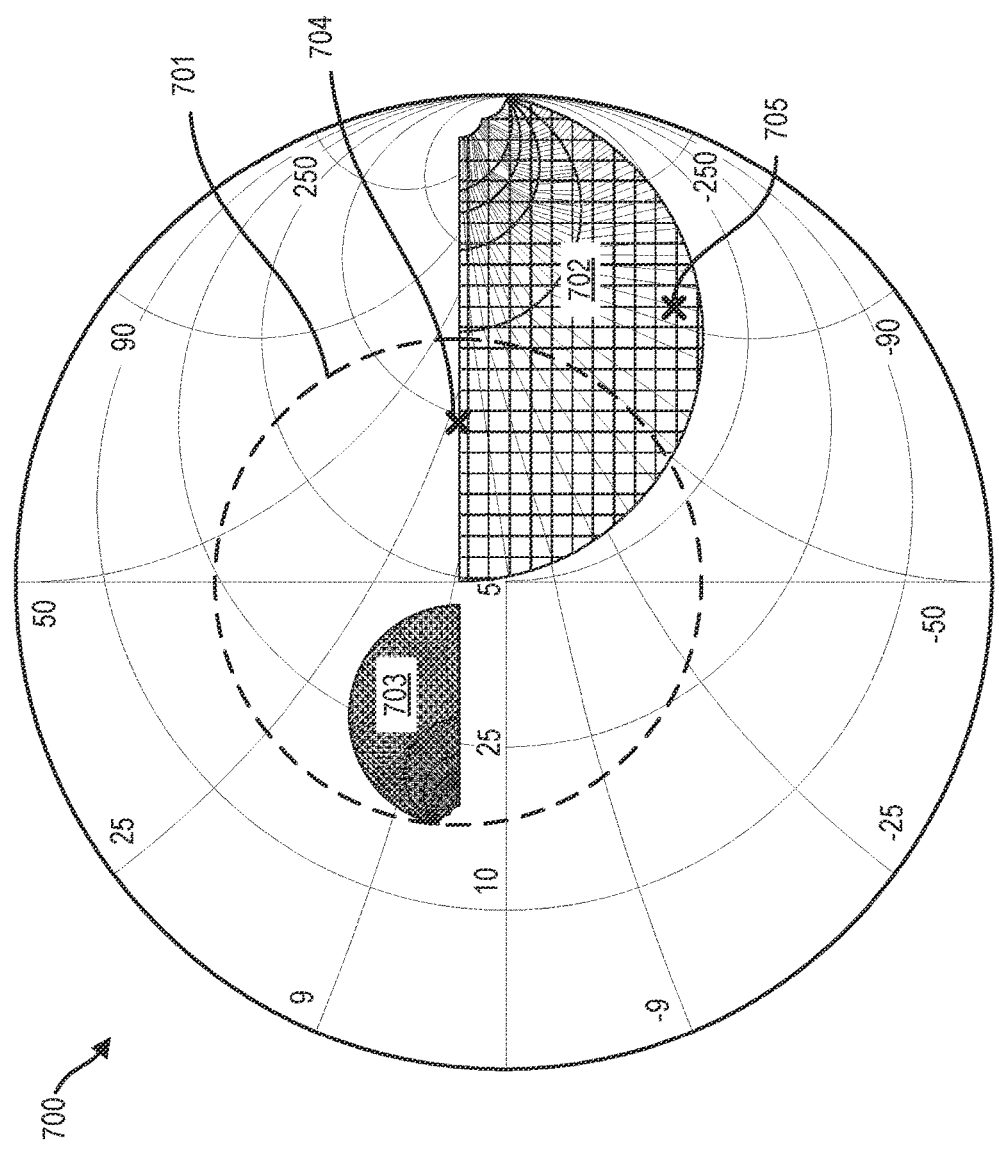
FIG. 7 is a Smith Chart which displays the transformation characteristic of the disclosed system on impedances with high resistive parts and capacitive reactive parts.

FIG. 7 is a Smith Chart 700 which displays the transformation characteristic of the disclosed system on impedances with high resistive parts and capacitive reactive parts. Accordingly, Smith Chart 700 displays a region 702 of impedances with high resistive parts and capacitive reactive parts which can be transformed into impedances that are within a target VSWR. Notably, region 702 of impedances with high resistive parts and capacitive reactive parts and the region 502 (see FIG. 5) of impedances with low resistive parts and capacitive reactive parts as illustrated in FIG. 5 constitute all capacitive impedances collectively on the Smith Chart 700. A person having ordinary skill in the art can appreciate that the bottom half of a standard Smith Chart represents the capacitive region of impedances thereon. Regions 702, 703 are exemplary as the region 702 of impedances with high resistive parts and capacitive reactive parts and the transformed region 703 may be greater than or less than what is shown in the example of FIG. 7. As such, the transformed region 703 may have a greater or lesser area on the Smith Chart 700 depending upon the target VSWR 701.

Advantageously, the system and method of the present disclosure can transform impedances with high resistive parts and capacitive reactive parts into the transformed region 703 that is within a target VSWR 701. Notably, the impedances within the transformed region 703 are inductive in accordance with implementations which employ an arc suppression device with a 90-degree, pi-network impedance transformer.

Lastly, FIG. 7 shows points 704, 705 which are within and outside of the target VSWR 701, respectively. Accordingly, the arc suppression device disclosed herein can transform any impedance with a high resistive part and a capacitive reactive part to an impedance within the target VSWR 701 regardless to whether the initial impedance is within or outside of the target VSWR 701.

Figure 8:
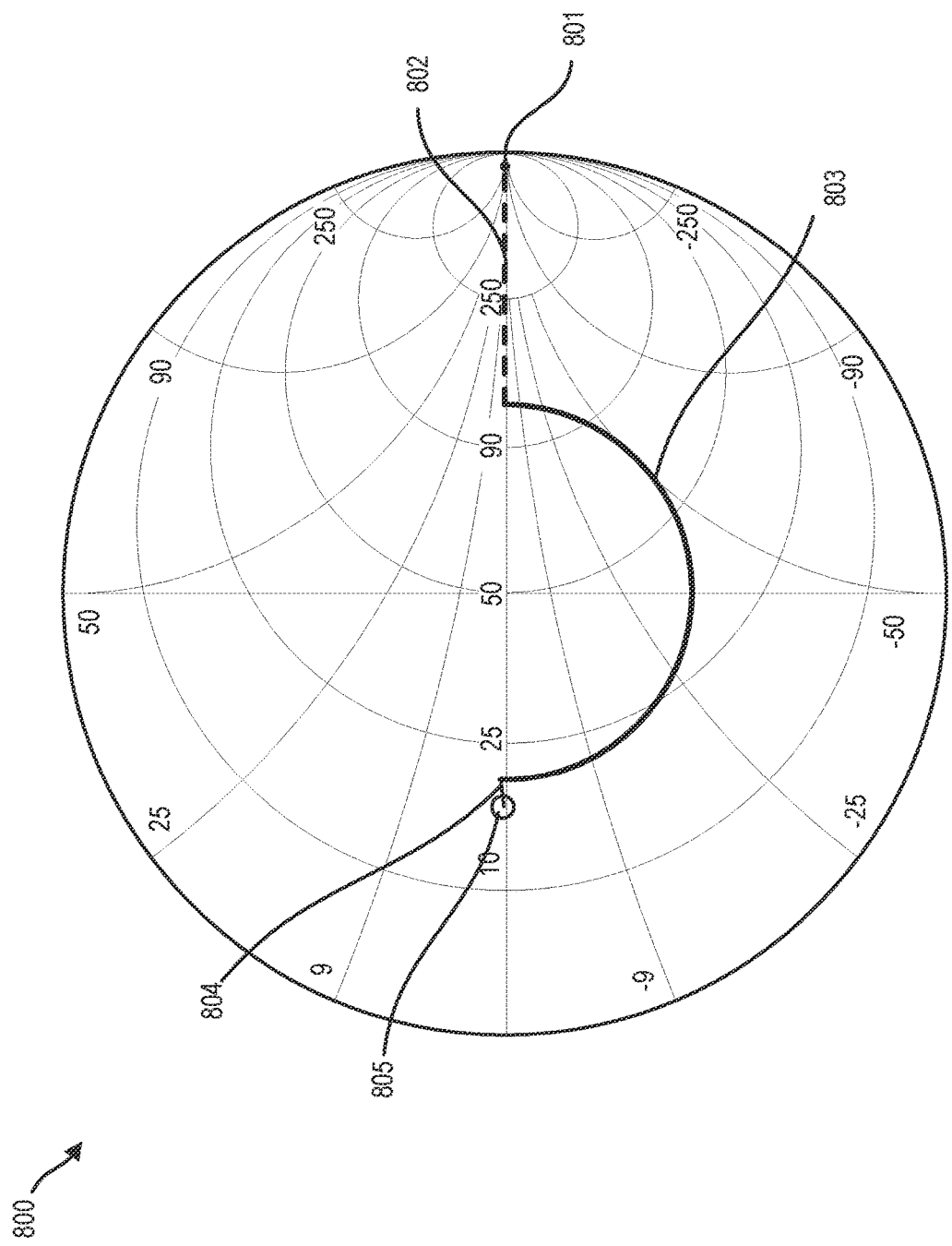
FIG. 8 is a Smith Chart which displays the pathway of impedance transformation of the disclosed system on example impedance with high resistance and no reactance.

FIG. 8 is a Smith Chart 800 which displays the pathway of impedance transformation of the disclosed system on example impedance with high resistance and no reactance. Accordingly, Smith Chart 800 displays an impedance transformation of an example high resistance and low reactance complex impedance. In the example shown in FIG. 8, the point 801 represents a complex impedance value of 2,500+0j ohms which is transformed into an impedance value of approximately 17.7+0.1j ohms as shown by the point 805 by an arc suppression device as previously disclosed. As shown, curves 802, 803, and 804 each show the contributions to impedance transformation from the terminations in a first and second shunt network (e.g., curves 802, 804) and by the 90-degree, pi-network impedance transformer (curve 803).

In the implementation shown, the impedance of the load in the first termination (corresponding to curve 802) is approximately 130−1j ohms and the impedance of the load in the second termination (corresponding to curve 803) is also approximately 130−1j ohms. Moreover, in the implementation shown, the impedance seen at the first shunt network is approximately 123.6−0.9j ohms, approximately 20.3+0.2j ohms at the 90-degree, pi-network impedance transformer, and approximately 17.7+0.1j ohms at the second shunt network.

Notably, the resulting VSWR (2.849) and reflection coefficient (0.480<) 180° of the transformed impedance is within a VSWR and reflection coefficient target range (e.g., 3:1 and 0.5, respectively). Moreover, the impedance represented by point 801 is transformed to by the point 805 90-degrees in accordance with implementations which employ an arc suppression device with a 90-degree, pi-network impedance transformer.

Figure 9:
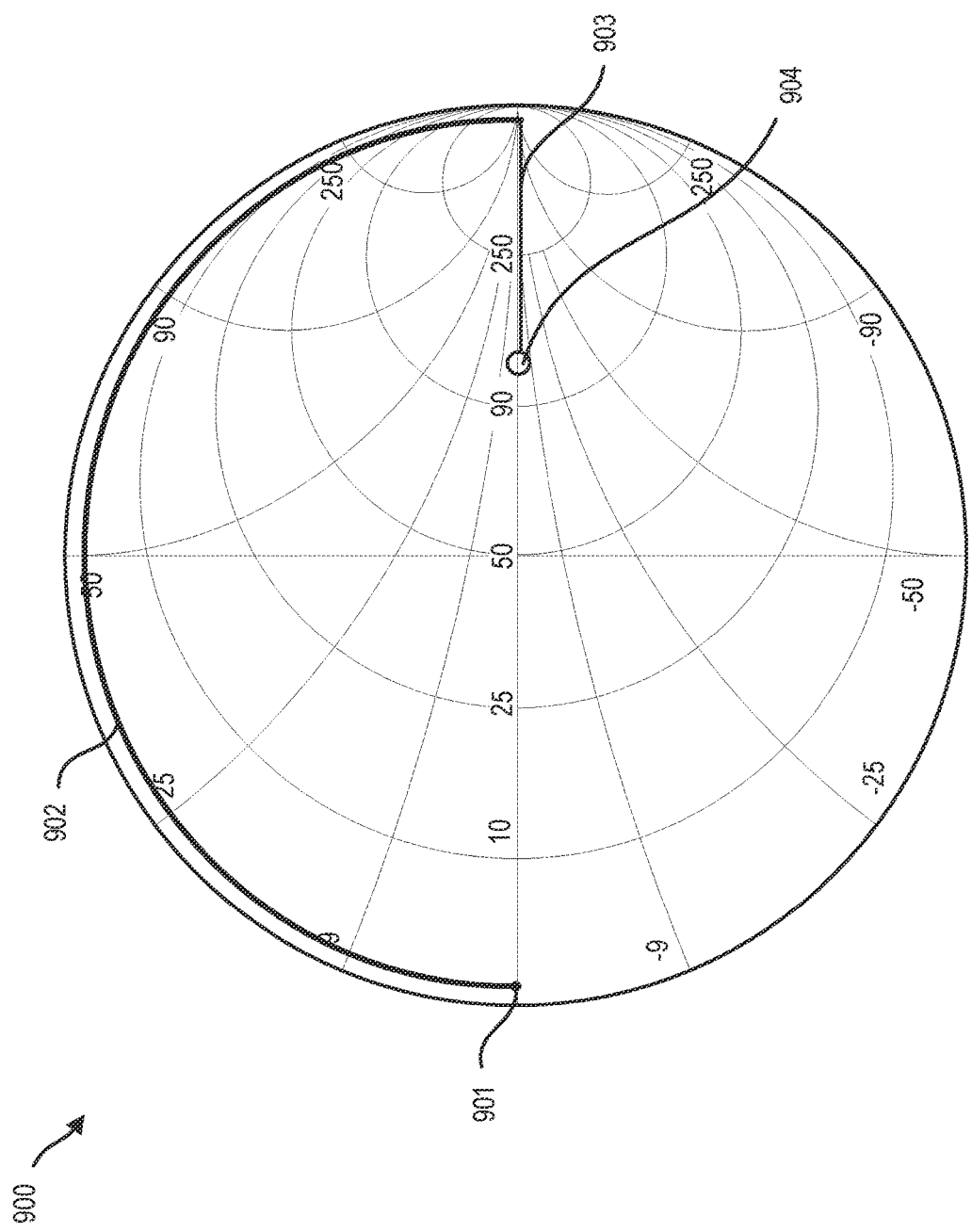
FIG. 9 is a Smith Chart which displays the pathway of impedance transformation of the disclosed system on example impedance with low resistance and no reactance.

FIG. 9 is a Smith Chart 900 which displays the pathway of impedance transformation of the disclosed system on example impedance with low resistance and no reactance. Accordingly, Smith Chart 900 displays an impedance transformation of an example low resistance and low reactance complex impedance, according to a system and method of the present disclosure. In the example shown in FIG. 9, the point 901 represents a complex impedance value of 1+0j which is transformed to an impedance value of approximately 123.4−1.1j ohms as shown by the point 904 by an arc suppression device as previously disclosed. As shown, curves 902, 903 each show the contributions to impedance transformation from the terminations in a first shunt network (e.g., curves 903) and by the 90-degree, pi-network impedance transformer (curve 902). Notably, in the example shown, the transformation is not significantly attributed to the second shunt network as compared to the impedance example shown in FIG. 8 (see curve 802).

In the implementation shown, the impedance of the load in the first termination (corresponding to curve 902) is approximately 130−1j ohms and the impedance of the load in the second termination (corresponding to curve 903) is approximately 130−1j ohms. Moreover, in the implementation shown, the impedance present at the first shunt network is approximately 1+0j ohms, approximately 2,420−97.2j ohms at the 90-degree, pi-network impedance transformer, and approximately 123.4−1.2j ohms at the second shunt network.

Notably, the resulting VSWR (2.468) and the reflection coefficient (0.425<−0.52°) of the transformed impedance is within a VSWR and reflection coefficient target range (e.g., 3:1 and 0.5, respectively).

Figure 10:
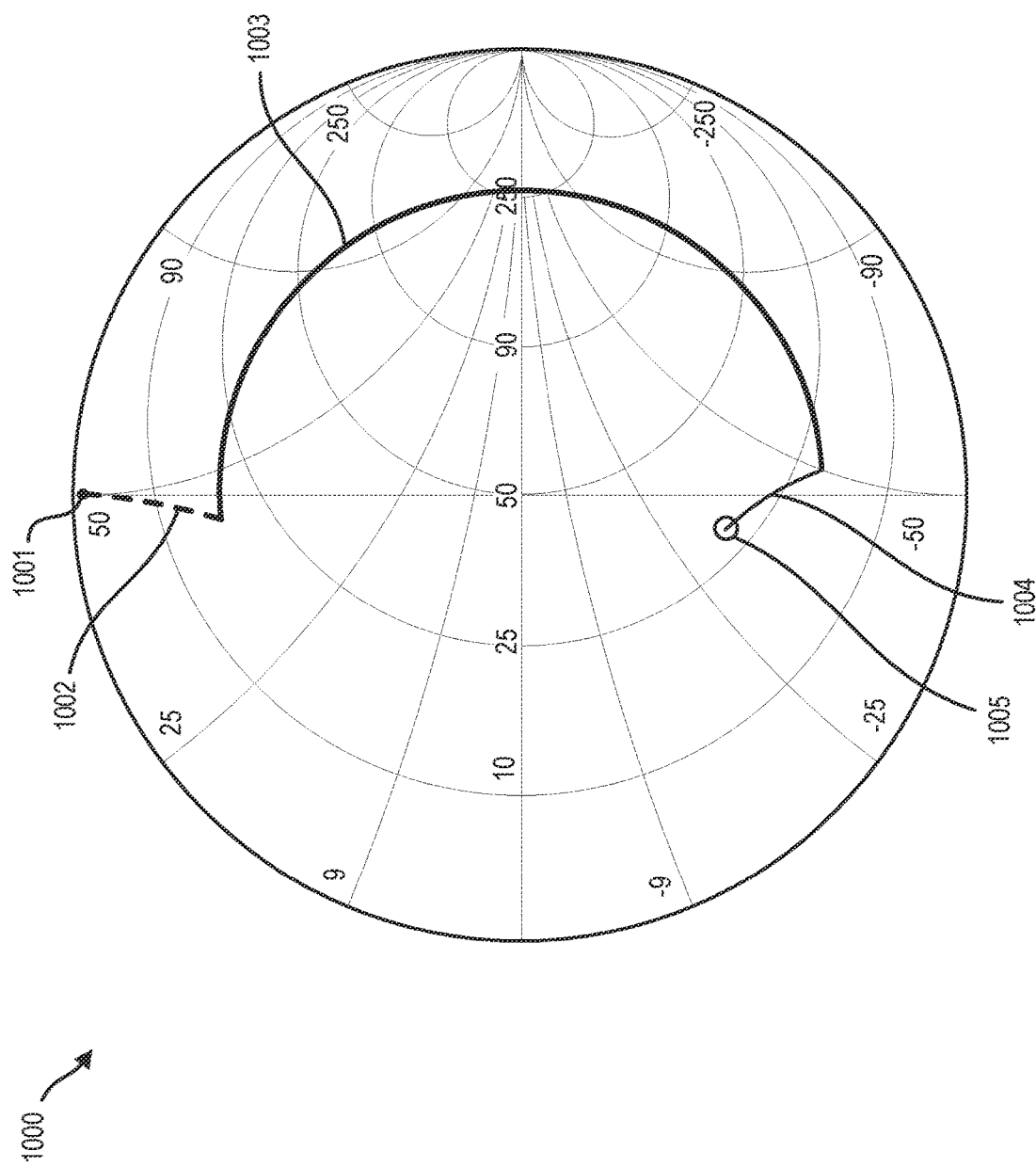
FIG. 10 is a Smith Chart which displays the pathway of impedance transformation of the disclosed system on example impedance with low resistance and inductive reactance.

FIG. 10 is a Smith Chart 1000 which displays the pathway of impedance transformation of the disclosed system on example impedance with low resistance and inductive reactance. Accordingly, Smith Chart 1000 displays an impedance transformation of an example low resistance and high positive reactance complex impedance. In the example shown in FIG. 10, the point 1001 represents a complex impedance value of 1+50j ohms which is transformed into an impedance value of approximately 28.5−33.6j ohms as shown by the point 1005 by an arc suppression device as previously disclosed. As shown, curves 1002, 1003, and 1004 each show the contributions to impedance transformation from the terminations in a first and second shunt network (e.g., curves 1002, 1004) and by the 90-degree, pi-network impedance transformer (curve 1003).

In the implementation shown, the impedance of the load in the first termination (corresponding to curve 1002) is approximately 130−1j ohms and the impedance of the load in the second termination (corresponding to curve 1004) is approximately 130−1j ohms. Moreover, in the implementation shown, the impedance present at the first shunt network is approximately 17.5+43.1j ohms, approximately 20.2−49.8j ohms at the 90-degree, pi-network impedance transformer, and approximately 28.5−33.6j ohms at the second shunt network.

Notably, the resulting VSWR (2.749) and the reflection coefficient (0.487<−99°) of the transformed impedance is within a VSWR and reflection coefficient target range (e.g., 3:1 and 0.5, respectively). Moreover, the impedance represented by point 1001 is transformed to impedance represented by the point 1005 ninety degrees in accordance with implementations which employ an arc suppression device with a 90-degree pi-network transformer.

Figure 11:
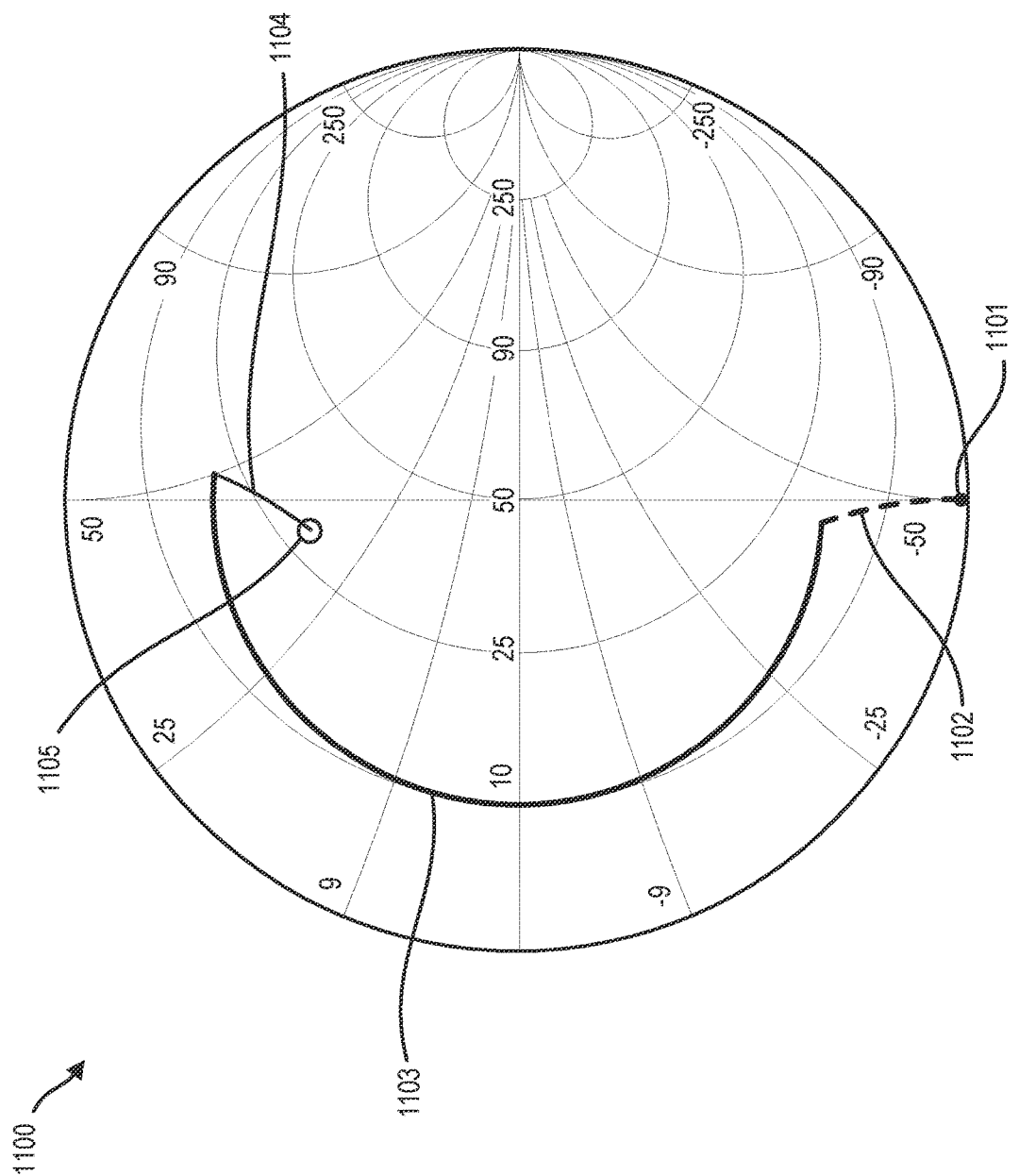
FIG. 11 is a Smith Chart which displays the pathway of impedance transformation of the disclosed system on example impedance with low resistance and capacitive reactance.

FIG. 11 is a Smith Chart which displays the pathway of impedance transformation of the disclosed system on example impedance with low resistance and capacitive reactance. Accordingly, Smith Chart 1100 displays an impedance transformation of a low resistance and high negative reactance complex impedance. In the example shown in FIG. 11, the point 1101 represents a complex impedance value of 1−50j ohms which is transformed into an impedance value of approximately 29.0+33.8j ohms as shown by the point 1105 by an arc suppression device as previously disclosed. As shown, curves 1102, 1103, and 1104 each show the contributions to impedance transformation from the terminations in a first and second shunt network (e.g., curves 1102, 1104) and by the 90-degree pi-network transformer (curve 1103).

In the implementation shown, the impedance of the load in the first termination (corresponding to curve 1102) is approximately 130−1j and the impedance of the load in the second termination (corresponding to curve 1103) is approximately 130−1j. Moreover, in the implementation shown, the impedance seen at the first shunt network is approximately 17.3−42.9j ohms, approximately 20.4+50.2j ohms at the 90-degree, pi-network impedance transformer, and approximately 29.0−33.8j ohms at the second shunt network.

The resulting VSWR (2.722) and the reflection coefficient (0.469<99°) of the transformed impedance is within a VSWR and reflection coefficient target range (e.g., 3:1 and 0.5, respectively). Furthermore, the impedance represented by point 1101 is transformed to the impedance represented by point 1105 ninety degrees in accordance with implementations which employ an arc suppression device with a 90-degree, pi-network impedance transformer. Notably, the curves 1102, 1103, and 1104, which represent the impedance transformation associated with elements within the arc suppression device is a transposition, although quasi-symmetrical, to the impedance amplitude and phase angle associated with the example shown in FIG. 11.

Figure 12:
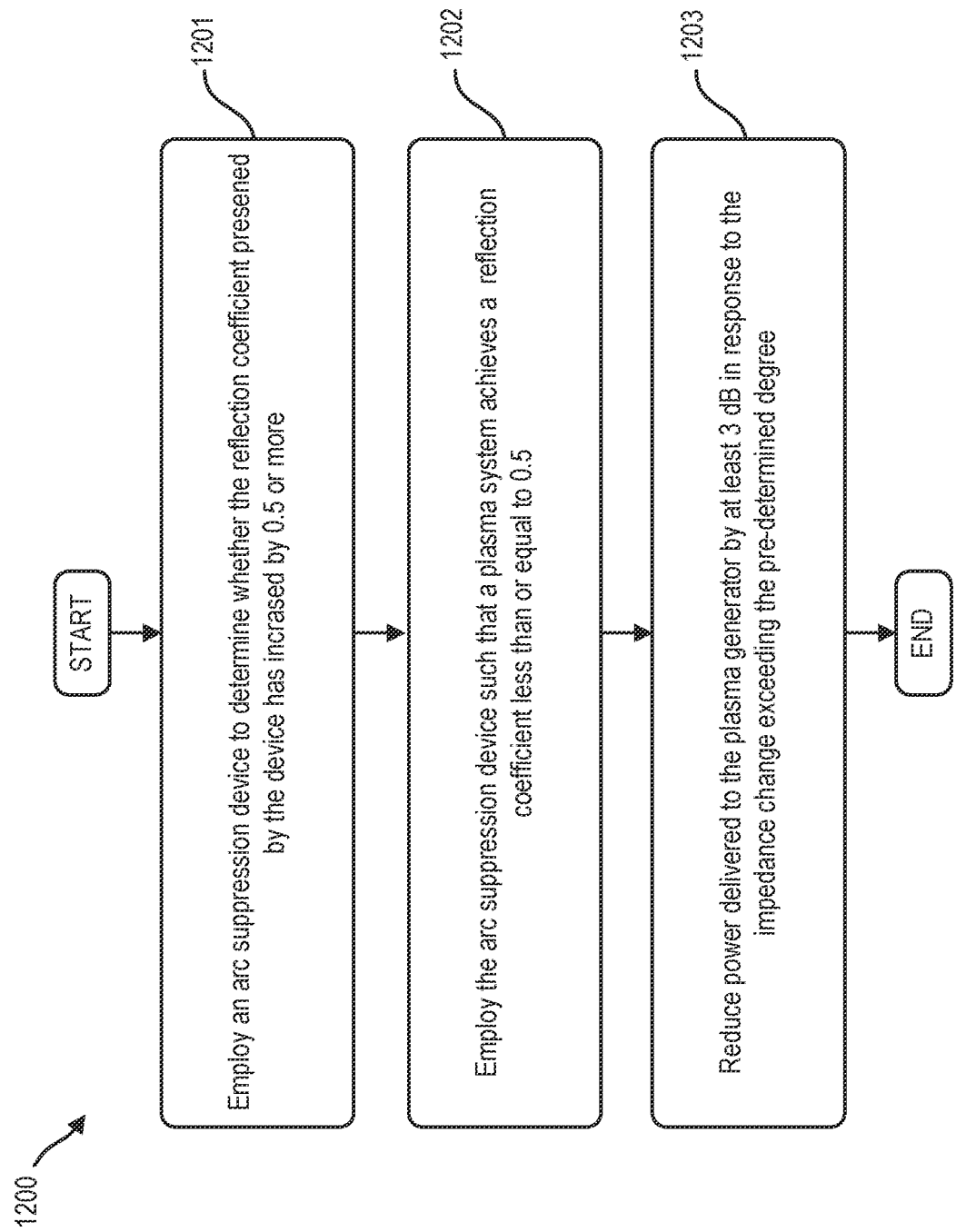
FIG. 12 is a flowchart of a method of suppressing an arc event, according to a system and method of the present disclosure.

FIG. 12 is a flowchart 1200 of a method of suppressing an arc event, according to a system and method of the present disclosure. Flowchart 1200 begins with block 1201 which includes employing an arc suppression device to determine whether the reflection coefficient presented by the device has increased by 0.5, or more. As previously described, this may be accomplished by an arc suppression device as depicted in FIG. 2. Next, block 1202 includes employing the arc suppression device, as in the example provided, such that the impedance presented to the RF generator produces a reflection coefficient of less than or equal to 0.5 regardless of the state of the plasma processing module.

Furthermore, in the example provided, reducing power delivered to the plasma chamber by at least 3 dB in response to a change in gamma which exceeds a pre-determined degree (e.g., greater than a 0.5 gamma shift over a short time period), according to block 1203. As it would be understood by a person having ordinary skill in the art, a power reduction of at least 3 dB is approximately 50% in power reduction. Accordingly, a 50% power reduction may be sufficient in many instances to extinguish a plasma arc event. It is possible for design variations to exist that result in different power reduction amounts by adjusting the values of the termination resistors. It is also possible for the trigger signal that engages/disengages the switching elements to be enacted as result of some change in operational parameters, such as current, voltage, phase angle, spectral content, or some combination of these factors, as opposed to only being triggered by a sharp change in gamma.

Although the present disclosure has been described in detail, it should be understood that various changes, substitutions and alterations can be made without departing from the spirit and scope of the disclosure. Any use of the words "or" and "and" in respect to features of the disclosure indicates that examples can contain any combination of the listed features, as is appropriate given the context.

While illustrative implementations of the application have been described in detail herein, it is to be understood that the inventive concepts may be otherwise variously embodied and employed, and that the appended claims are intended to be construed to include such variations, except as limited by the prior art.

Reference throughout this specification to "one implementation" or "an implementation" means that a particular feature, structure, or characteristic described in connection with the implementation is included in at least one implementation of the present disclosure. Thus, the appearances of the phrases "in one implementation" or "in some implementations" in various places throughout this specification are not necessarily all referring to the same implementation. Furthermore, the particular features, structures, or characteristics may be combined in any suitable manner in one or more implementations.

In the foregoing specification, a detailed description has been given with reference to specific exemplary implementations. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense.

What is claimed is:

1. A device, comprising:
 a first network comprising:
  a first switching element, including a first switch, to engage upon receiving a triggering signal; and
  a first power dissipater to be engaged by the first switching element to dissipate both stored and delivered energy when the first switching element engages;
 a second network comprising:
  a second switching element, including a second switch, to engage upon receiving the triggering signal; and
  a second power dissipater to be engaged by the second switching element to dissipate both stored and delivered energy when the second switching element engages; and
 an impedance transformer coupled to each of the first power dissipater and the second power dissipator to perform an impedance transformation that, when the first switching element and the second switching element are engaged in conjunction with their respective power dissipater, reduces a reflection coefficient at an input of the device, the first network and the second network being disposed on opposite sides of the impedance transformer.

2. The device of claim 1, wherein each respective switching element includes at least one of a PIN diode, silicon carbide field effect transistor ("SiCFET"), metal oxide semiconductor field effect transistor ("MOSFET"), insulated-gate bipolar transistor ("IGBT"), or bipolar junction transistor ("BJT").

3. The device of claim 1, wherein each of the first switch and the second switch reacts to the triggering signal on an order of microseconds.

4. The device of claim 1, wherein the impedance transformer is a 90-degree impedance transformer that employs a lumped element pi-network.

5. The device of claim 1, wherein the impedance transformer is at least one of a coaxial transmission line, a broadside coupled transmission line, an embedded transmission line, or a waveguide.

6. The device of claim 1, wherein the power dissipater includes a resistive element that is non-inductive.

7. The device of claim 1, wherein the reflection coefficient is reduced to a range of 0-0.5.

8. The device of claim 1, wherein the switching elements can be engaged ganged, or actuated individually.

9. The device of claim 1, wherein the triggering signal is the result of a change in reflection coefficient of at least 0.5.

10. A matching network system, comprising:
 a matching network device, comprising:
  a plurality of reactive elements; and
  a controller configured to provide a respective control signal to each of the actuating devices for the plurality of reactive elements such that, in response to the respective control signal provided thereto, each reactive element is actuated in accordance with that control signal; and
 an arc suppression device, comprising:
  a first network comprising:
   a first switching element, including a first switch, to engage upon receiving a triggering signal; and
   a first power dissipater to be engaged by the first switching element to dissipate both stored and delivered energy when the first switching element engages;
  a second network comprising:
   a second switching element, including a second switch, to engage upon receiving the triggering signal; and
   a second power dissipater to be engaged by the second switching element to dissipate both stored and delivered energy when the second switching element engages; and
  an impedance transformer coupled to each of the first power dissipater and the second power dissipator to perform an impedance transformation that, when the first switching element and the second switching element are engaged in conjunction with their respective power dissipater, reduces a reflection coefficient at an input of the device, the first network and the second network being disposed on opposite sides of the impedance transformer.

11. The matching network system of claim 10, wherein the triggering signal is a change in current, voltage, or reflection coefficient that exceeds a pre-determined threshold over some period of time.

12. The matching network system of claim 10, wherein the first switching element and the second switching element connect their respective power dissipater to ground.

13. The matching network system of claim 10, wherein the engagement of the arc suppression device reduces the power delivered to a plasma chamber by at least 3 dB.

14. A plasma generation system, comprising;
 a radio frequency generator;
 an arc suppression device coupled to the radio frequency ("RF") generator, the arc suppression device comprising:
  a first network comprising:
   a first switching element, including a first switch, to engage upon receiving a triggering signal; and
   a first power dissipater to be engaged by the first switching element to dissipate both stored and delivered energy when the first switching element engages;
  a second network comprising:
   a second switching element, including a second switch, to engage upon receiving the triggering signal; and
   a second power dissipater to be engaged by the second switching element to dissipate both stored and delivered energy when the second switching element engages; and
  an impedance transformer coupled to each of the first power dissipater and the second power dissipator to perform an impedance transformation that, when the first switching element and the second switching element are engaged in conjunction with their respective power dissipater, reduces a reflection coefficient at an input of the device, the first network and the second network being disposed on opposite sides of the impedance transformer;
 a matching network coupled to the radio frequency generator; and
 a plasma chamber coupled to the matching network.

15. The plasma generation system of claim 14, wherein the triggering signal is provided to the arc suppression device by the RF generator.

16. The plasma generation system of claim 14, wherein the plasma chamber includes a sensor that determines when an arc event occurs and provides the triggering signal to the arc suppression device responsive to the arc event determination.

17. The plasma generation system of claim 16, wherein the sensor is at least one of an optical sensor or an electrical sensor.

18. The plasma generation system of claim 14, wherein the triggering signal is a composite of multiple sensed signals obtained at least in part by additional sensors distributed throughout the plasma generation system.

19. The plasma generation system of claim 14, wherein the impedance transformer is further to, in conjunction with the first power dissipater and the second power dissipater, perform an impedance transformation to reduce the reflection coefficient at an input of the system to less than 0.5.

20. The plasma generation system of claim 14, further comprising a digital isolator coupled to the arc suppression device.

* * * * *